United States Patent [19]
Riley et al.

[11] Patent Number: 5,292,686
[45] Date of Patent: Mar. 8, 1994

[54] METHOD OF FORMING SUBSTRATE VIAS IN A GAAS WAFER

[75] Inventors: Susan Riley, Gaston; Terri L. Clayton, Aloha, both of Oreg.

[73] Assignee: TriQuint Semiconductor, Inc., Beaverton, Oreg.

[21] Appl. No.: 810,740

[22] Filed: Dec. 18, 1991

Related U.S. Application Data

[63] Continuation-in-part of Ser. No. 748,202, Aug. 21, 1991, abandoned.

[51] Int. Cl.⁵ ............................................. H01L 21/26
[52] U.S. Cl. ..................................... 437/173; 437/203; 437/227; 437/184; 437/974
[58] Field of Search ............... 437/173, 174, 203, 227, 437/974, 230, 184; 148/DIG. 26, DIG. 50, DIG. 135; 257/777

[56] References Cited

U.S. PATENT DOCUMENTS

| | | | |
|---|---|---|---|
| 4,437,109 | 3/1984 | Anthony et al. | 257/777 |
| 4,612,408 | 9/1986 | Moddel et al. | 437/227 |
| 4,832,789 | 5/1989 | Cochran et al. | 437/203 |
| 4,840,923 | 6/1989 | Flagello et al. | 437/203 |
| 4,964,212 | 10/1990 | Deroux-Dauphin et al. | 437/173 |
| 4,978,639 | 12/1990 | Hua et al. | 148/DIG. 135 |
| 5,075,238 | 12/1991 | Solomon | 437/185 |
| 5,166,097 | 11/1992 | Tanielian | 437/203 |

FOREIGN PATENT DOCUMENTS 63-73643  4/1988  Japan ..................... 437/184

OTHER PUBLICATIONS

Laser Drilling of Via Holes in GaAs for RF Wafer Scale Integration; Clarke et al; Westinghouse Science and Technology Center; Proceeding of U.S. Conference on GaAs; 1989.

"New applications of a 30W(MM)ND+³. YAG Laser: GaAs Via Drilling and ITO Etching"; A. Khachentourians, Proceedings of the 1986 International Symposium on Micrelec. pp. 100–104.

Primary Examiner—Brian E. Hearn
Assistant Examiner—Michael Trinh
Attorney, Agent, or Firm—Skjerven, Morrill, MacPherson, Franklin & Friel

[57] ABSTRACT

A method of forming substrate vias in a GaAs wafer begins with a GaAs wafer in which all top side processing steps are complete. The top surface of the GaAs wafer includes top surface via contacts, which are in electrical contact with the bottom surface ground plane once the ground vias are complete. A protective layer is formed on the top surface of the wafer to protect the finished integrated circuitry. A portion of the substrate is removed from the bottom surface to achieve a thin layer of substrate material. The bottom surface of the thinned substrate is metalized with a first metal layer. Laser via holes are drilled into the thinned substrate from the bottom surface of the wafer to within a few microns from the top surface metal via contacts. The laser holes are drilled by emitting a controlled number of single pulses over the selected via location. The substrate vias are subsequently wet etched to remove the remaining substrate thickness and the bottom surface of the wafer and the substrate via holes are metalized with a second metal layer. The second metal layer fills the via holes and establishes electrical contact between the top surface via contacts and the bottom surface ground plane. In a final step, the protective layer is removed from the top surface of the wafer.

36 Claims, 10 Drawing Sheets

LASER OPTIC PATH

ABSORPTION DEPTH VS. WAVELENGTH

METHOD OF FORMING SUBSTRATE VIAS IN A GAAS WAFER

This is a continuation-in-part of U.S. patent application Ser. No. 07/748,202, filed Aug. 21, 1991 now abandoned.

BACKGROUND OF THE INVENTION

This invention relates generally to a method of forming substrate vias for connecting a top surface via contact in an integrated circuit to a bottom surface ground plane and, more particularly, to a manufacturable method of forming the substrate vias in a thinned GaAs wafer.

Monolithic microwave integrated circuit ("MMIC") manufacturers are well aware of the need for low inductance source grounding to achieve high RF gain. Traditionally, source grounding was achieved by etching vias through the substrate and subsequently metallizing the vias with gold, providing a conducting path between the ground plane on the back of the die to front side interconnect of the die. The conductive paths through the semi-insulating GaAs substrate are known to improve the RF gain of MMIC amplifiers and therefore play a critical role in the circuit's electrical performance.

Until recently, the process for fabricating substrate vias in GaAs wafers has been accomplished with wet chemical etching or dry plasma etching. However, both of these techniques have undesirable characteristics. Dry chemical etching imposes increased safety risks, and wet chemical etching does not produce the uniform results needed for dependable, high yielding circuits. In addition, production throughput is limited by the etching rates using either of these techniques.

Production throughput can also be limited by the physical handling of the GaAs wafer. The top surface of the wafer must be protected during bottom surface processing. Typically, this is accomplished by coating the top surface of the wafer with a protective coating, or creating a sandwich of the GaAs wafer with a carrier wafer. As wafer sizes have increased to a four inch diameter, removing the protective coating or carrier wafer can be a difficult and slow process with attendant risks of damaging the wafer, thus limiting production throughput.

Accordingly, a need remains for a manufacturable method of fabricating vias in GaAs wafers that does not impose a safety risk, produces uniform results, has a well controlled depth, and does not limit production throughput or damage the wafer.

SUMMARY OF THE INVENTION

It is, therefore, an object of the invention to provide uniform GaAs vias suitable for use as low inductance ground contacts to the bottom surface ground plane.

Another object of the invention is to provide a safe, manufacturable method for drilling holes into a GaAs wafer that does not limit throughput.

It is yet a further object of the invention to provide a via in a GaAs substrate with a well controlled, predetermined depth.

It is still a further object of the invention to provide a method of handling a large size GaAs wafer during the manufacturing process that does not damage the wafer.

According to the present invention, a method of forming substrate vias in a GaAs wafer begins with a GaAs wafer in which all top side processing steps are complete. The top surface of the GaAs wafer includes top surface via contacts, which are in electrical contact with the bottom surface ground plane once the ground vias are complete. A protective layer is formed on the top surface of the wafer to protect the finished integrated circuitry. A portion of the substrate is removed from the bottom surface to achieve a thin layer of substrate material. The bottom surface of the thinned substrate is metallized with a first metal layer. Laser via holes are drilled into the thinned substrate from the bottom surface of the wafer to within a few microns from the top surface metal via contacts. The laser holes are drilled by emitting a controlled number of single pulses from a frequency doubled Nd:YAG laser over the selected via location. The laser emits a green beam at a 0.532 μm wavelength at an effective repetition rate of 2.44 kHz. The number of pulses required is proportional to the thickness of the GaAs wafer. The substrate vias are subsequently wet etched to remove the remaining substrate material and the bottom surface of the wafer and the substrate via holes are metalized with a second metal layer. The second metal layer fills the via holes and establishes electrical contact between the top surface via contacts and the bottom surface ground plane. In a final step, the protective layer is removed from the top surface of the wafer.

The foregoing and other objects, features and advantages of the invention will become more readily apparent from the following detailed description of a preferred embodiment of the invention which proceeds with reference to the accompanying drawings.

DETAILED DESCRIPTION

Figure 1:
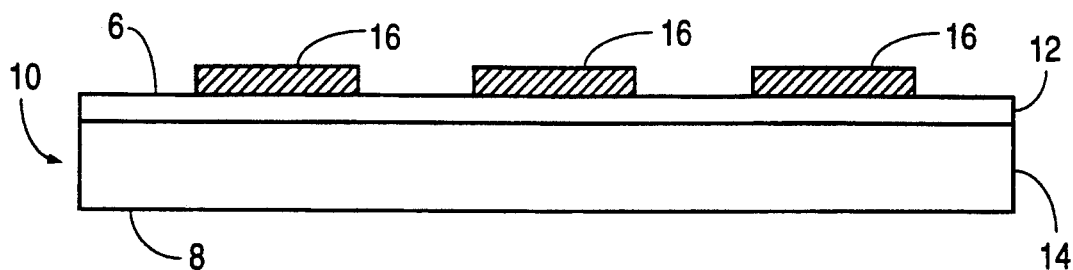
FIGS. 1, 2A, 2B and 3–9 are cross sections of a GaAs wafer and/or carrier wafer, which demonstrate the process flow of the method according to the present invention.

A portion of a GaAs wafer 10 is shown in the cross sectional diagram of FIG. 1. The portion shown is part of a single integrated circuit die. The wafer 10 has a top surface 6, an active integrated circuitry layer 12 including top surface metal via contacts 16 as well as diffusion layers and metal layers, a GaAs substrate 14, and a bottom surface 8. The wafer 10 shown in FIG. 1 is about twenty-five mils (1 mil=0.001 inch) thick and is substantially complete. All top side wafer processing steps have been performed. The top surface via contacts 16 designate locations o the integrated circuit at which a connection is desired to the bottom surface ground plan that will subsequently be formed on the bottom surface 8 of wafer 10. Once the connection is established to the bottom surface ground plane, the top surface via contacts will provide a stable ground reference voltage with very little associated parasitic impedance.

Figure 2A:
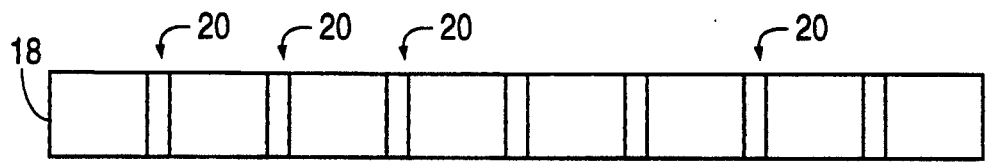
Figure 2B:
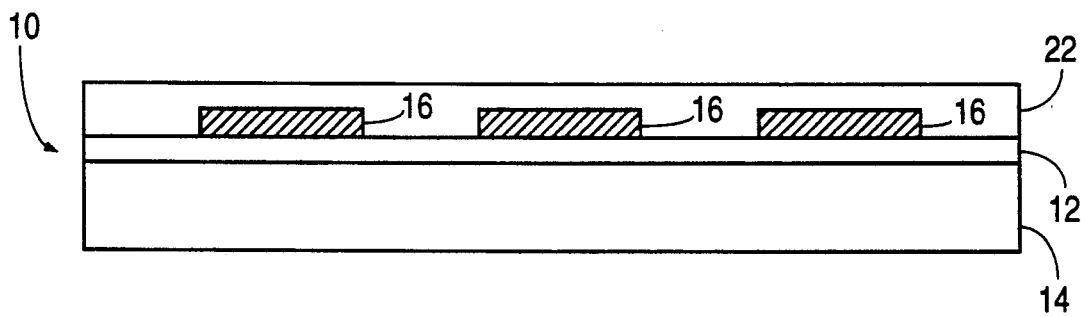
Figure 3:
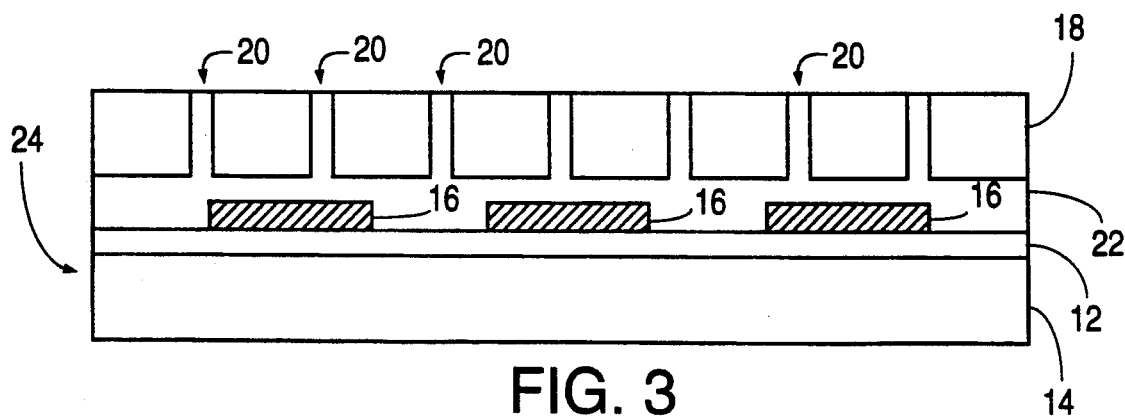
Figure 2C:
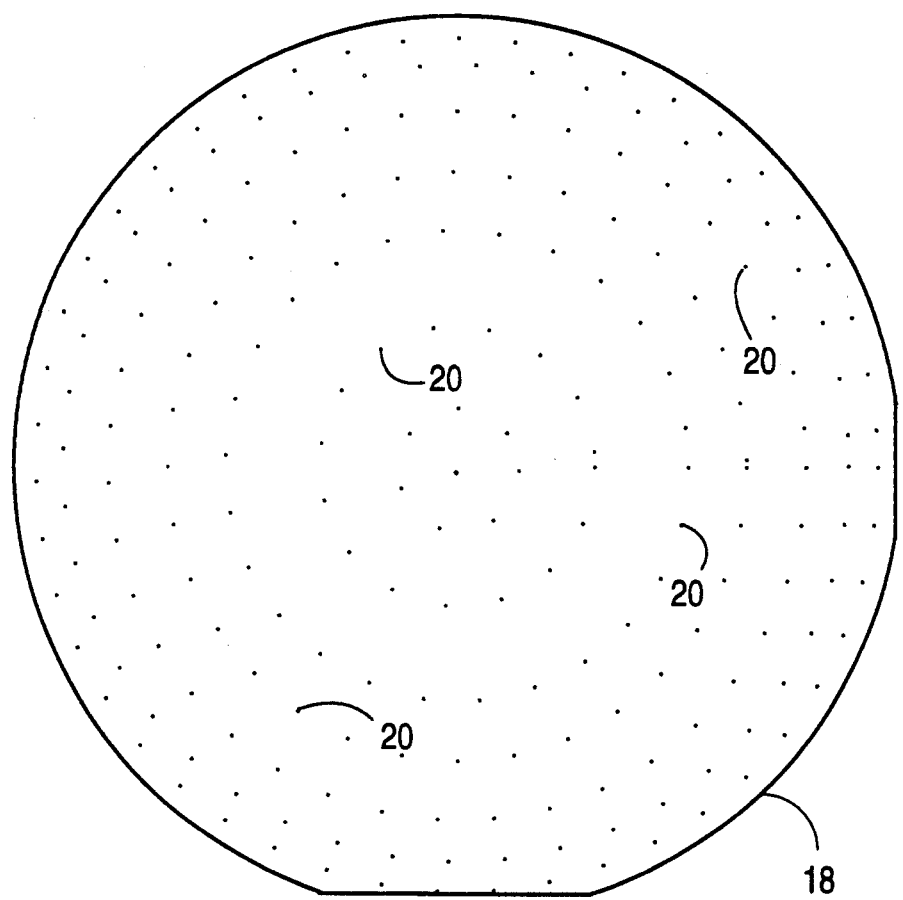
FIG. 2C is a plan view of a sapphire carrier wafer.

Referring now to FIGS. 2A-2C, damage to the top surface 6 of the wafer 10 is prevented during subsequent bottom surface processing steps by forming a protective layer. The step of forming a protective layer on the top surface 6 of the wafer 10 includes the steps of coating the top surface 6 with an adhesive layer 22, attaching a carrier wafer 18 to the adhesive layer 22, and applying pressure to the carrier wafer 18. A cross sectional view of the carrier wafer 18 is shown in FIG. 2A including holes 20, which extend through the carrier wafer 18. The carrier wafer 18 is a desirably a sapphire wafer having 1/32 inch holes spaced about ¼ inch apart. The carrier wafer is about twenty-one mils thick. A cross sectional view of the adhesive layer 22 on the top surface of the wafer 10 is shown in FIG. 2B. A plan view of the carrier wafer 18 is shown in FIG. 2C. Typically, the carrier wafer 18 and the GaAs wafer 10 are the same size, e.g. a four inch diameter wafer. In the preferred embodiment, the step of coating the top surface 6 comprises the step of spin coating the top surface 6 with about a four mil layer of Dynalith ®. Dynalith ® is an alkaline soluble protective coating that is about 10 to 30 percent 2-butoxyethanol and about 40-60 percent 2-butoxyethyl acetate, and is available from Dynachem Electronic Materials, 2631 Michelle Drive, Tusin, California 92680. The sapphire carrier wafer 18 is attached to the GaAs wafer 10 by applying five pounds of pressure to the carrier wafer. The resultant composite wafer 24 including the GaAs wafer 10, adhesive layer 22, and sapphire carrier wafer 18 is shown in FIG. 3. The excess adhesive material is pushed through the holes 20 and may be cleaned off before further processing steps are performed. The composite wafer 24 including the coupled GaAs and carrier wafers is subsequently baked in a vacuum oven for about one and a half hours at a temperature of about one hundred fifty degrees Celsius to assure that the adhesive layer is cured and the two wafers remain firmly attached during the subsequent processing steps.

Figure 4:
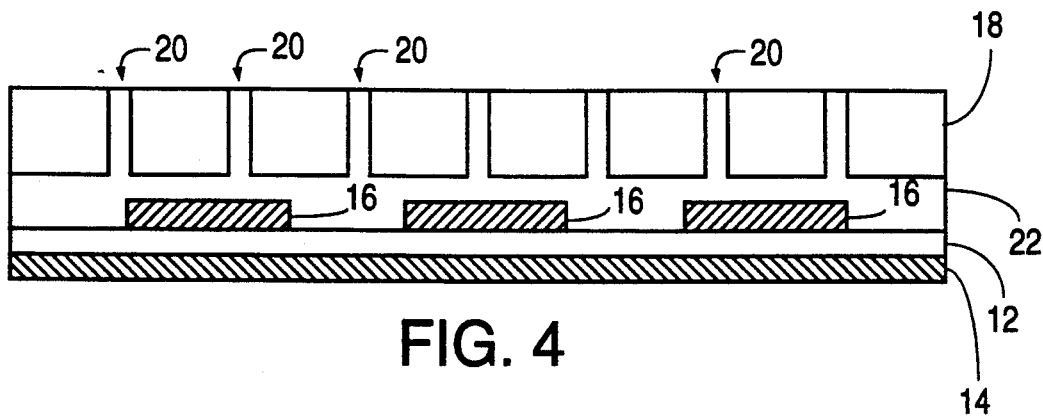

Referring now to FIG. 4, a portion of the substrate 14 is removed from the bottom surface 8 by grinding, which achieves a predetermined substrate thickness of about four mils (about 100 μm). Thinning the wafer simplifies the bottom surface processing steps, particularly subsequent laser drilling operations since there is less material to remove. However, the thinned wafer is more vulnerable to breaking during bottom surface processing. It is therefore highly desirable that the sapphire carrier wafer 18 remain firmly attached to the GaAs wafer 10 during all processing steps.

Figure 5:
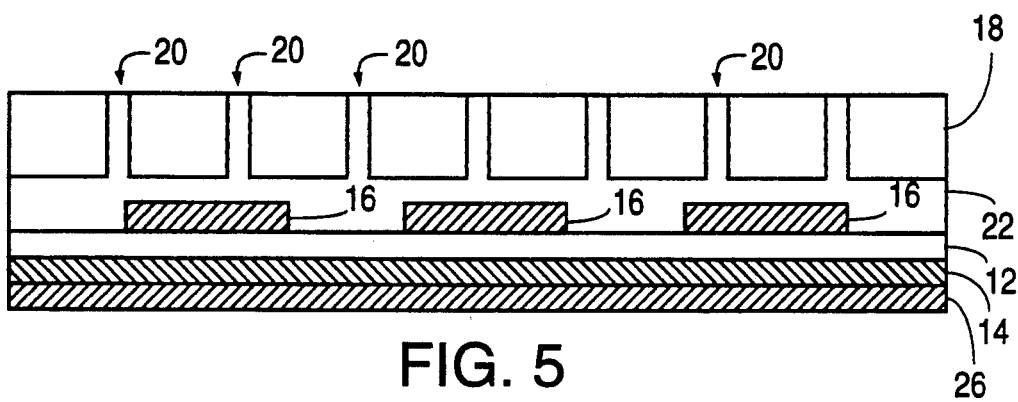

After the grinding operation has been completed, the bottom surface 8 of the composite wafer 24 is metalized with a first metal layer 26 as is shown in FIG. 5. The first metal layer 26 is desirably a composite of three deposited metal layers including a first barrier metal layer, an intermediate gold metal layer, and a second barrier metal layer. In the preferred embodiment, the first barrier metal layer is a titanium layer about one hundred fifty (150) Angstroms thick, the intermediate gold metal layer is a gold layer about three thousand five hundred (3500) Angstroms thick, and the second barrier metal layer is a titanium layer about one hundred (100) Angstroms thick. The barrier metal layers prevent subsequent metal migration by the gold layer as is known in the art.

Figure 6:
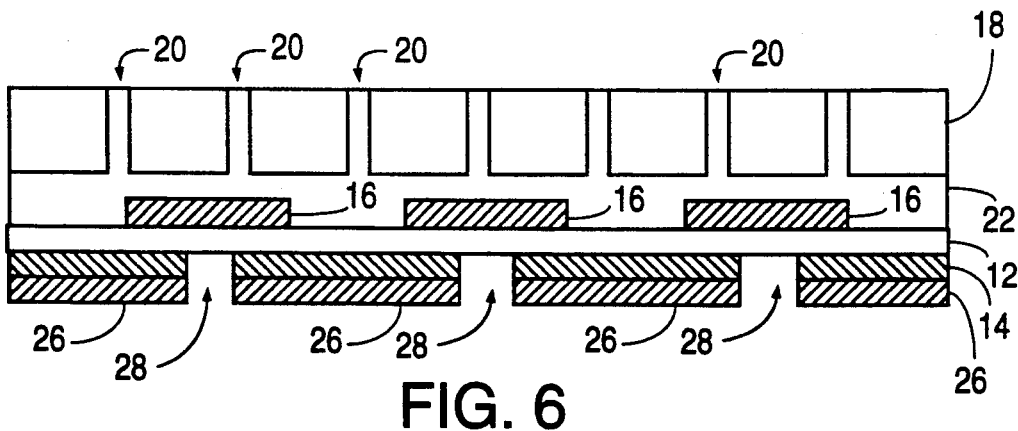

Referring now to FIG. 6, subsequent to the depositing of the first metal layer 26, via holes 28 are laser drilled into the substrate 14 from the bottom surface of the wafer to within a predetermined substrate thickness from the top surface metal via contacts 16. In the preferred embodiment, substrate via holes 28 are laser drilled to within about fifteen microns (15 μm) from the respective top surface metal via contacts 16. The via holes 28 are laser drilled into the substrate 14 by positioning a frequency doubled Nd:YAG laser above the selected via location (determined by the top surface via contacts 16 and alignment features, which are described in further detail below) and emitting a controlled number of single pulses from the frequency doubled Nd:YAG laser over the selected via location at a predetermined repetition rate. The repetition rate minimizes the mechanical damage to the laser hole site, and results in a uniform, well controlled, and manufacturable laser drilled via hole 28. The operation of the laser is described in further detail below.

Figure 7:
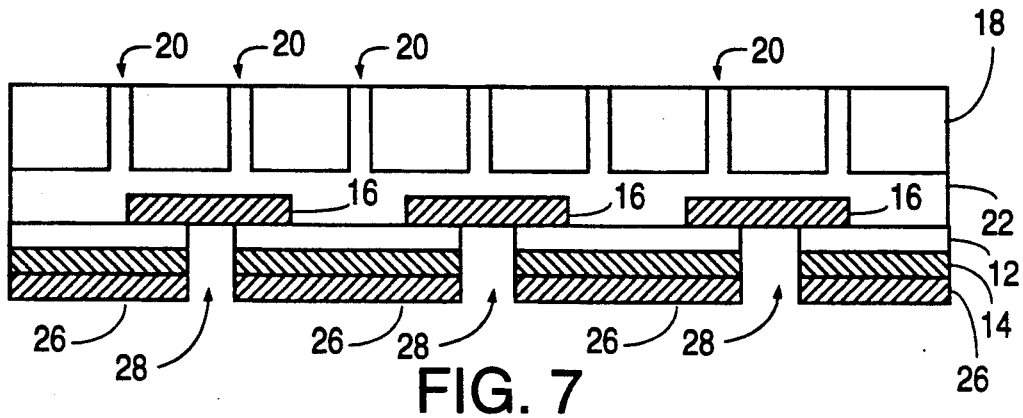

The laser holes 28 are drilled to within a known distance from the top surface via contacts 16 to prevent mechanical damage to the via contacts 16. The remaining substrate material is removed by wet etching. The wet etch used is desirably a preferential etch to the GaAs substrate material. That is, the enchant used does not etch the metal of the via contacts 16 and thus stops the etching process once all the remaining substrate material is removed. The completed via holes 28 (all substrate material removed) are shown in FIG. 7. The substrate via holes 28 are desirably wet etched with a combination citric acid and hydrogen peroxide solution. The ratio of hydrogen peroxide to citric acid is desirably 20% by weight. To ensure that all substrate material is removed, it is desirable to rotate the composite wafer 24 in the etching solution and bombard the composite wafer 24 with ultrasonic or megasonic sound waves. It has been found that megasonic sound waves provide a more uniform etch and are therefore particularly suitable for processing wafers in batches.

Figure 8:
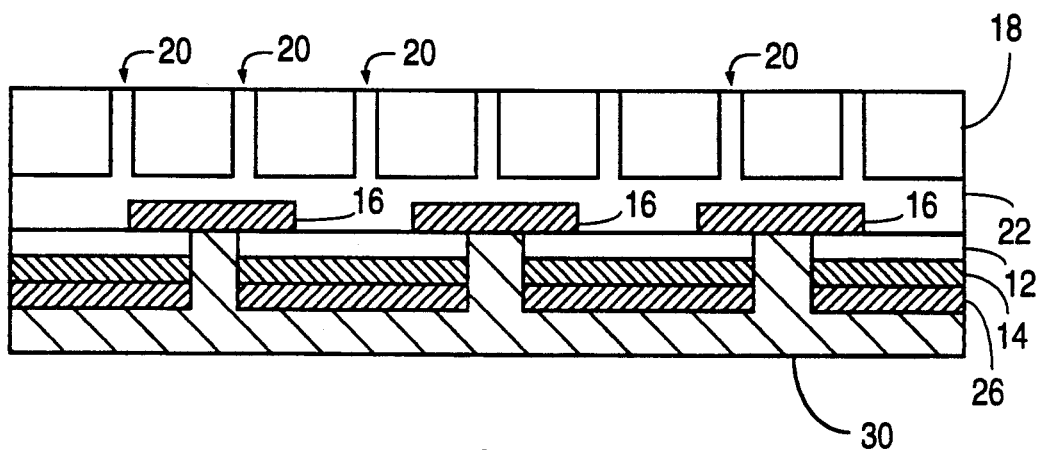

Referring now to FIG. 8, the bottom surface ground plane is established and substrate vias 31 are formed by metalizing the bottom surface and the substrate vias holes 28 with a second metal layer 30. The second metal layer includes deposited first, second, and third metal layer components. The first metal layer component is a titanium layer about eight hundred (800) Angstroms thick, the second metal layer component is a palladium layer about four hundred (400) Angstroms thick, and the third metal layer component is a gold layer about four thousand five hundred (4500) Angstroms thick. Once the second metal layer 30 is deposited, the bottom surface ground plane is established and the conductive substrate vias 31 are fully formed. The thickness of the ground plane is increased by a gold plating operation. The plated up gold layer (not shown in FIG. 8) decreases ground plane parasitic resistance as well as retaining a gold bottom surface for eutectic die attach once the GaAs wafer 10 has been sawed into individual integrated circuit die. The bottom surface is desirably plated with a gold layer about 2.3 microns thick.

The final step in the method of forming the conductive vias 31 and the bottom surface ground plane 30 is removing the protective layer including the sapphire carrier wafer 18 and the adhesive layer 22 from the GaAs wafer 10. Since both wafers may be four inches in diameter, it is of vital importance that the carrier wafer 18 and adhesive layer be removed without damaging the GaAs wafer 10 in any fashion. At the final method step, the unit cost of the individual integrated circuit die is quite high, since all top surface and bottom surface processing steps have been completed, with only the sawing of the wafer, packaging, and final test steps remaining. Care must be taken, for example, that the GaAs wafer 10 is not chipped or cracked, and that none of the top surface features are scratched. The apparatus and method for removing the protective layer is explained in further detail below.

Figure 9:
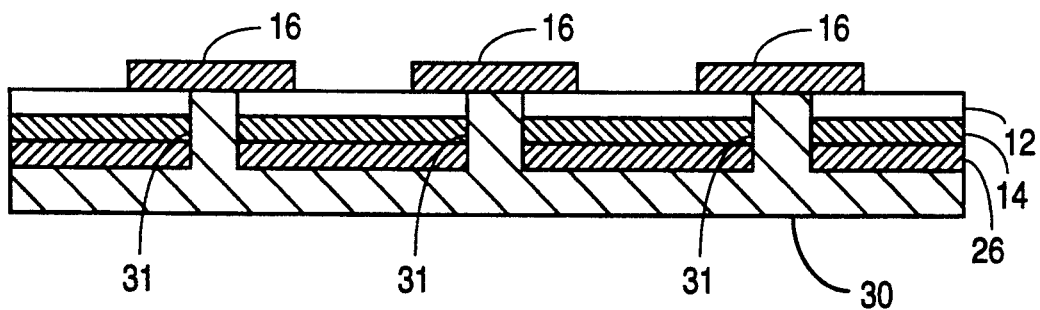

Thus, FIG. 9 shows a cross section of a portion of wafer within a single integrated circuit die. The adhesive layer 22 and carrier wafer 18 are removed, leaving an integrated circuit with the following characteristic components: a thinned GaAs substrate 14, an active circuit layer 12, front surface via contacts 16 (which contact other metal features), a back surface ground plane including first and second metal layers 26 and 30, and conductive metal substrate vias 31 that electrically couple the contacts 16 to the bottom surface ground plane with minimum parasitic resistance. Thus, an extremely stable ground reference is provided at various points in the circuit, which is desirable for use in RF circuits.

Front Side Alignment Features

Figure 10:
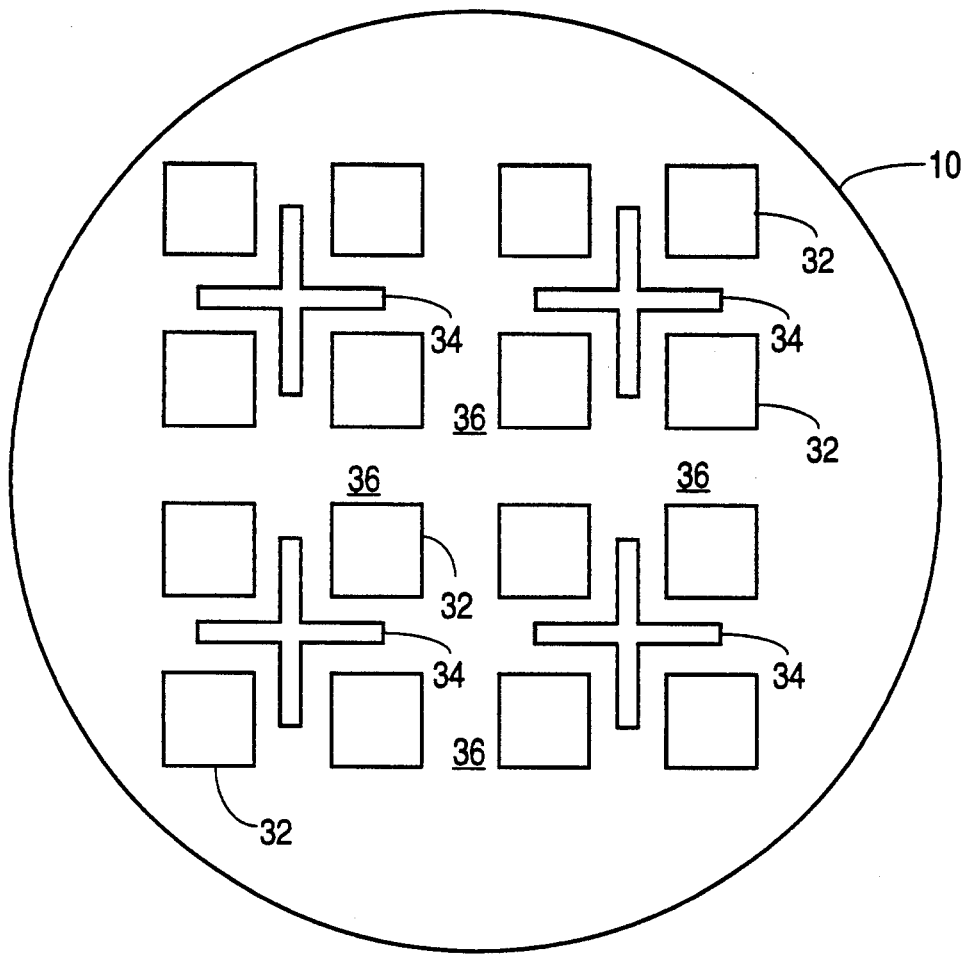
FIG. 10 is a plan view of a GaAs wafer showing individual integrated circuit die and alignment features.

Cruciform alignment features are shown on the front surface of a GaAs wafer 10 in FIG. 10. Sixteen individual integrated circuit die 32 are shown along with four alignment features 34, but the exact number of die and alignment features can vary with the size of the die and wafer. The integrated circuit die 32 are separated horizontally and vertically by "scribe streets" 36 or inactive wafer surface area. The scribe streets 36 are typically wide enough to accommodate a diamond saw blade that is used to separate the individual die 32. The alignment features 34 are placed in the scribe streets 36 and, therefore, do not consume any additional wafer area. The size of the scribe streets 36 and alignment features 34 are not necessarily drawn to scale. The front surface alignment features 34 can be patterned into the scribe streets 36 using any convenient, distinguishable circuit layer.

Figure 11:
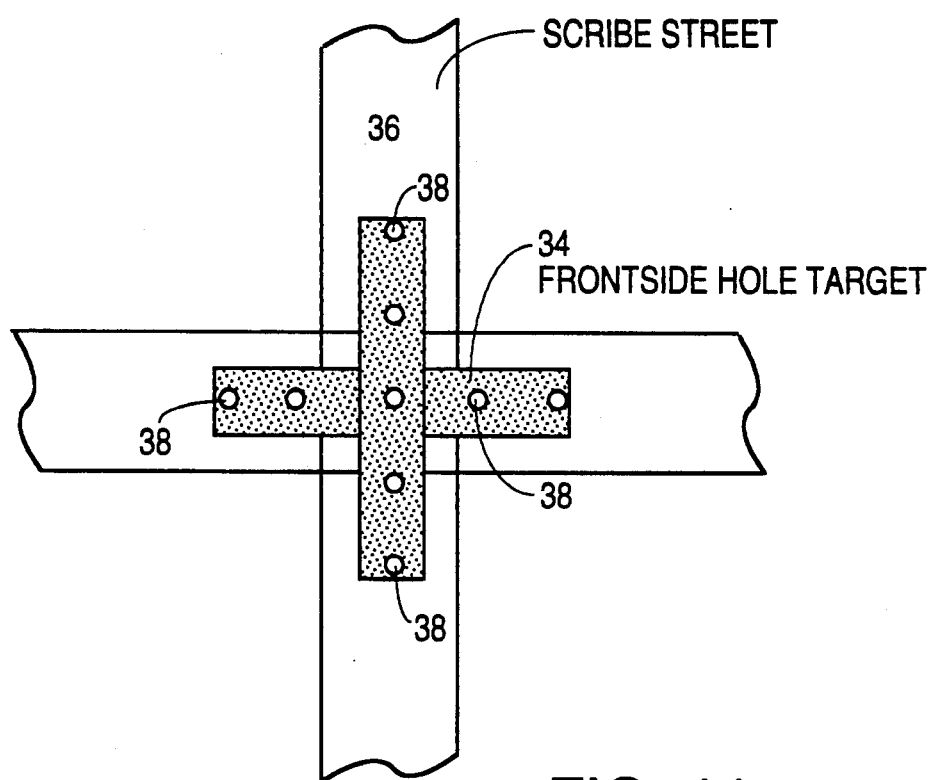
FIG. 11 is a more detailed plan view of an alignment feature.

A further detailed view of the alignment feature 34 is shown in FIG. 11. The detail of FIG. 11 reveals that the alignment feature 34 (also known as a front surface hole target) includes a number of laser holes 38. The laser holes 38 are laser drilled to a predetermined depth that is greater than the final thickness of the thinned GaAs wafer 10. Therefore, when the GaAs wafer 10 is thinned by the grinding step, the alignment patterns formed by laser holes 38 are revealed when viewed from the bottom surface. The revealed pattern on the bottom surface serves as an alignment feature for aligning a substrate via mask. The substrate via mask contains all the locations at which substrate vias 31 (best seen in FIG. 9) are to be formed. The bottom surface of the wafer 10 is coated with a layer of photoresist after the first level metal layer 26 has been formed. The photoresist layer is developed with the aligned substrate via mask to mark each substrate via location for the subsequent laser drilling operation.

Carrier Wafer Mount/Demount Method

Figure 12:
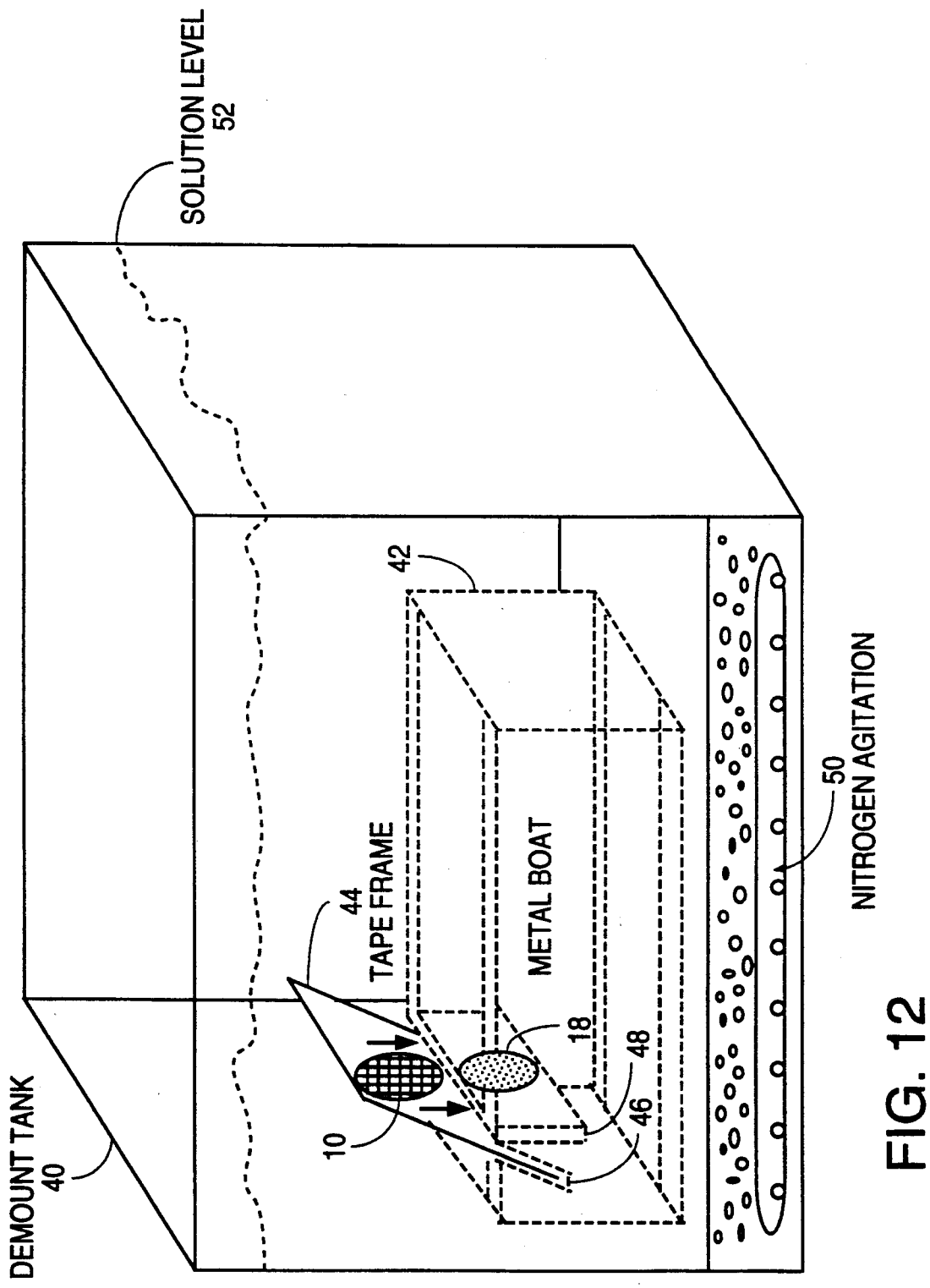
FIG. 12 is a perspective view of a demount tank apparatus according to the present invention.

A demount apparatus is shown in FIG. 12, which includes a demount tank 40, a metal boat 42 for receiving the carrier wafer 18 in slot 48, a tape frame 44 positioned in slot 46 for holding the composite wafer 24, nitrogen agitation apparatus 50, and a developer solution 52 sufficient to cover the entire composite wafer 24.

The demount method for removing the protective layer begins by applying a tape frame 44 to the bottom surface 8 of the composite wafer 24. The tape frame 44 is a common, standard apparatus in the semiconductor industry which simply comprises an aluminum frame having a circular hole larger than the diameter of the wafer that is to be held. The circular hole in the tape frame 44 is covered with an adhesive tape film having sufficient adhesive strength to securely hold the wafer in position. The composite wafer 24 is secured to the tape frame 44, and the tape frame 44 is then loaded into slot 46 in the metal boat 42. Note that slot 46 is angled approximately eleven degrees from vertical and that the portion of the tape frame 44 holding the composite wafer 24 overhangs slot 48 in boat 42. The metal demount boat 42 is placed into a developer bath 52 (a potassium hydroxide aqueous solution) in the demount tank 40. The solution level of the developer bath 52 is sufficient to entirely immerse the composite wafer 24. The temperature of the developer bath is desirably maintained at about fifty degrees Celsius. Once the composite wafer 24 is fully immersed in the developer bath, the developer bath solution begins to slowly dissolve the adhesive layer of Dynalith®. To more quickly and completely dissolve the adhesive layer, and to ensure that the GaAs wafer 10 separates from the carrier wafer 18 without damage, the developer bath 52 is agitated with nitrogen bubbles from the bottom of the demount tank 40. Holes 20 in carrier wafer 18 assist in the separation process by allowing the Dynalith® to enter the adhesive layer 22. If desired, the developer bath can be bombarded with ultrasonic sound waves to reduce the time required until the wafers separate. After about and hour and a half the adhesive layer is completely dissolved, the carrier wafer 18 drops into the vertical slot 48, and the undamaged thinned GaAs wafer 10 remains securely attached to the tape frame 44. The tape frame 44 with attached GaAs wafer 10 is removed from the developer bath and dried. The same tape frame 44 can be used in the diamond sawing of wafer 10 to separate the individual integrated circuit die in the normal manner.

It will be appreciated by those skilled in the art that the mount/demount method of the present invention can be adapted to any bottom surface processing steps, such as merely grinding a GaAs or Silicon wafer, and it is not limited to the above described method of forming conductive substrate vias in a GaAs wafer. The process begins by coating the top surface of the wafer with an adhesive layer of Dynalith®, and then attaching a carrier wafer to the adhesive layer, applying pressure to the carrier wafer, completing any desired bottom surface processing such as grinding or marking the wafer, applying a tape frame to the bottom surface, loading the tape frame into a demount boat, and placing the demount boat into a developer bath to dissolve the adhesive layer and separate the GaAs or silicon wafer from the carrier wafer as described above.

Laser Drilling Apparatus and Method

Figure 13:
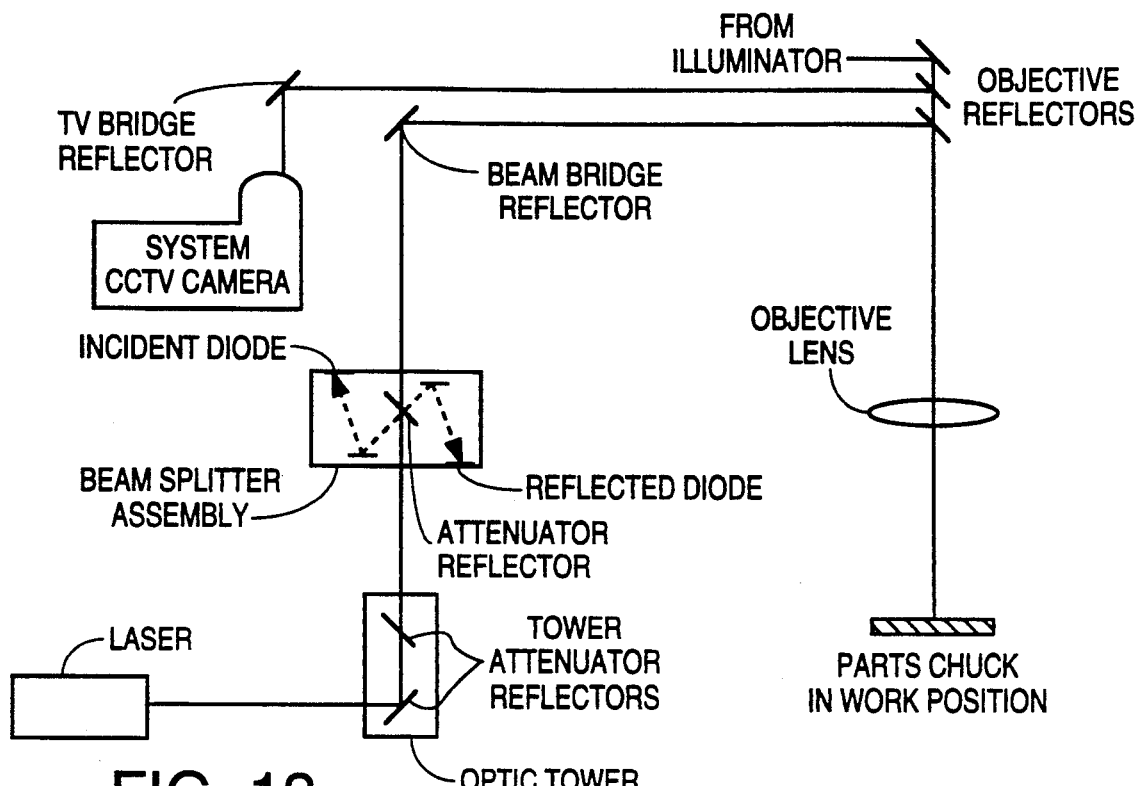
FIG. 13 is a block diagram of the laser optic path used in forming vias in accordance with the present invention.

The laser medium is a Nd:YAG rod pumped with a krypton arc lamp and is Q-switched to achieve high peak power. The laser is mounted on an ESI Model 8000b Laser Processing System, the elements of which are illustrated in FIG. 13. The 8000b was designed for memory circuit repair using single pulses, and the memory repair software had to be modified slightly for this application. The beam positioner is moved with linear motors and has 2.5 $\mu$m resolution. The beam is guided from the output coupler of the laser to a 50 mm objective lens with a series of steering mirrors. Two of these mirrors are adjustable so that when properly aligned the beam will be centered in the lens anywhere within the field of travel. For this application, the beam is restricted to $\frac{1}{4}$ inch travel in the X-Y axis. The objective lens focuses the beam to a diameter of about 46 $\mu$m with $\pm 1$ $\mu$m depth of focus, although the actual via diameter will be smaller due to material interaction.

Figure 14:
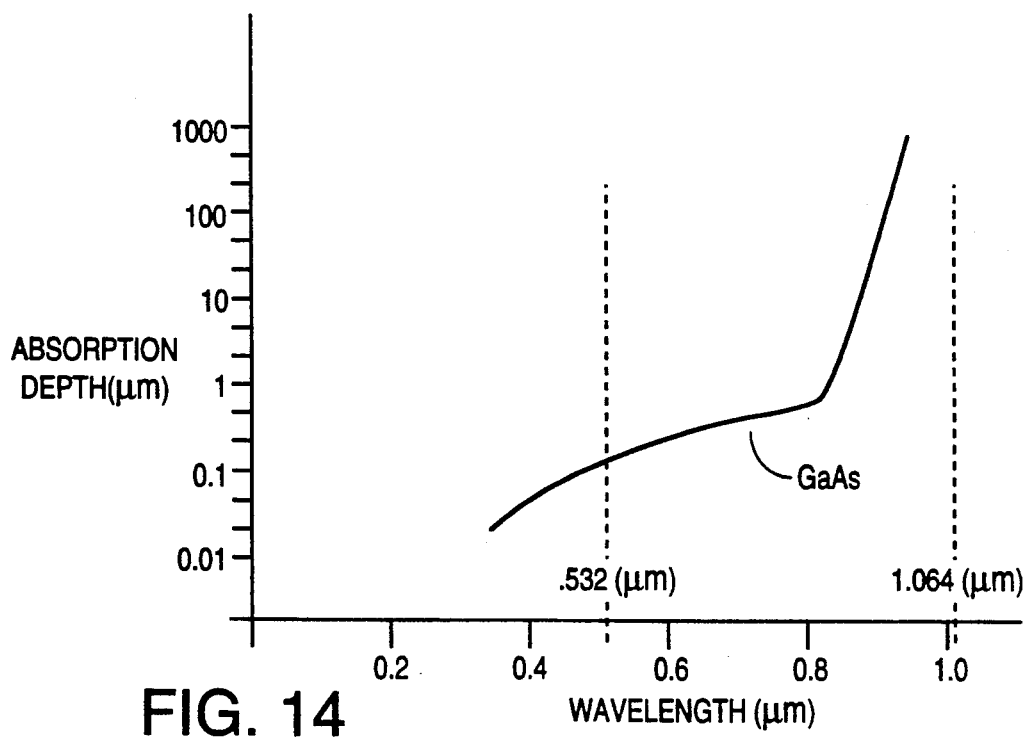
FIG. 14 is a plot of absorption depth vs. wavelength for GaAs.

The natural operating wavelength of the Nd:YAG rod is 1.064 $\mu$m. With the installation of a frequency doubling lithium iodate crystal a green beam at 0.532 $\mu$m wavelength is achieved. The specified average power for the laser is 100 mwatts at 1 kHz pulse rate, although this particular one has been adjusted to operate at 200 mwatts. The advantage of using the second harmonic frequency is its superior coupling characteristics into GaAs over the fundamental frequency. FIG. 14 shows that the absorption depth in GaAs with energy at 0.532 $\mu$m wavelength is very small compared to the absorption depth with energy at 1.064 $\mu$m wavelength. GaAs is about 55% transmissive at 1.06 $\mu$m wavelength and 0% transmissive at a wavelength of 0.532 $\mu$m. High quality vias can be drilled at a consistent rate of 1000 per minute. The rate is partially dependent on the movement of the optic arm between vias in addition to the drilling parameters discussed above.

Figure 15:
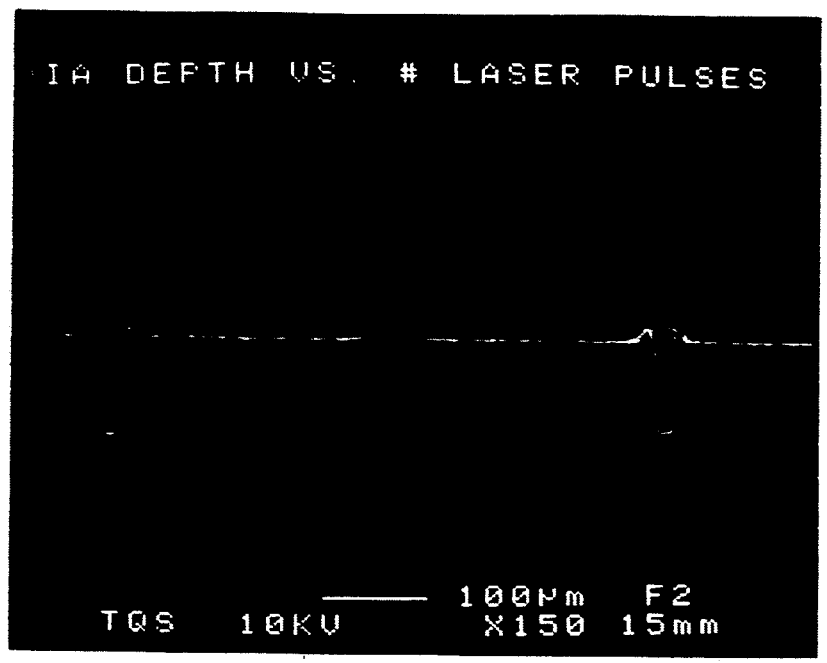
FIG. 15 is a photomicrograph of incremental via depth with increasing repetitions of the applied laser pulse.

The drilling process consists of positioning the objective lens over a selected location and emitting a controlled number of single pulses from the laser. Experimentation shows a linear relationship between the number of pulses and the depth of the hole. FIG. 15 illustrates (from right to left) how the depth of the holes in a 100 $\mu$m thick substrate increases with an increasing number of pulses. It is therefore quite easy to determine the number of pulses required to drill a via. Better depth control can be achieved by using a controlled single pulse method rather than letting the laser run freely in a Q-switched mode for a given amount of time. The effective repetition rate is 2.44 Khz for the drilling process, resulting in 40 mwatts average power. To break these data down further, the energy per pulse is 16.4 $\mu$joules. The pulse width of the beam is 50 ns at fwhm.

Figure 16:
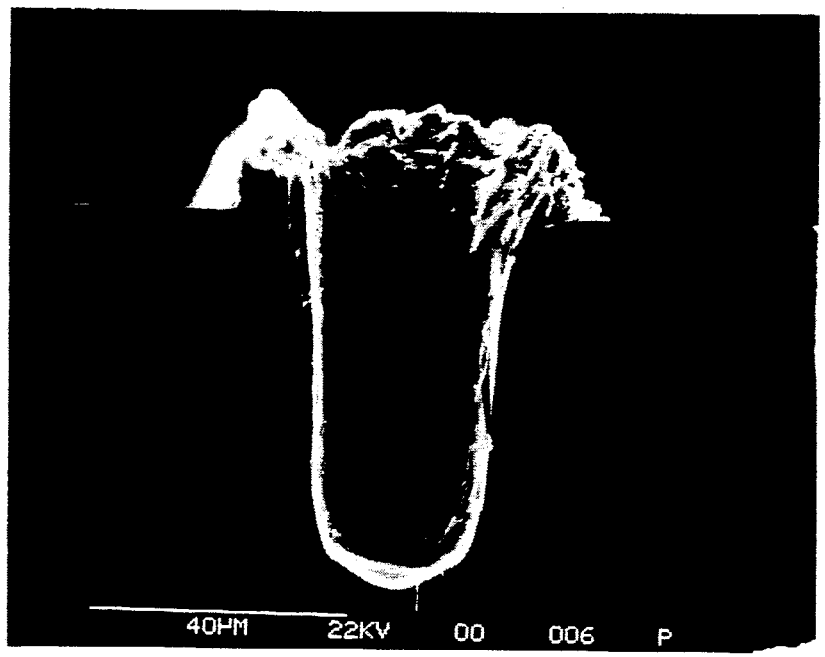
FIG. 16 is a photomicrograph of a cylindrical via hole at a depth of 60 μm.

Repeatable, cylindrical vias of 28 $\mu$m diameter were achieved with the above indicated parameters. A photomicrograph of an actual via hole with a depth of 60 $\mu$m is shown in FIG. 16. The via wall profile is extremely vertical which allows for a high yielding product. The drilling rate using the second harmonic frequency was found to be dependent upon the repetition rate of the pulses emitted and the peak power density. The average power measured at the work surface did not appear to be a major factor in the drilling rate. The diameter is determined primarily by the focused objective lens but is also material dependent.

Figure 17:
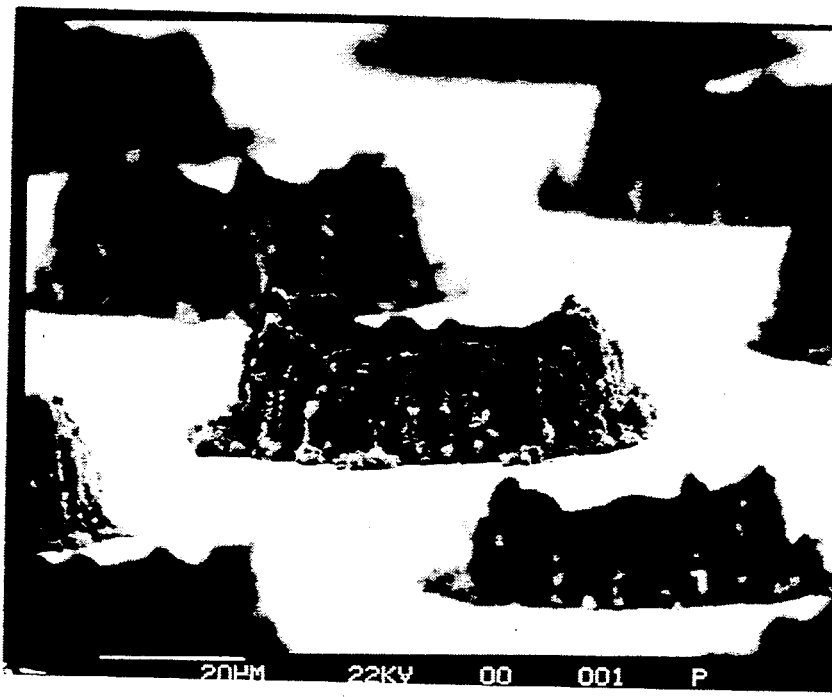
FIG. 17 is a photomicrograph of molten debris on the GaAs wafer surface that is left subsequent to the laser drilling process of the present invention.

The laser drilling process, which is thermal in nature, vaporizes the GaAs and ejects the debris at high velocities from the via opening. Some of the molten debris is re-deposited on the wafer surface near the via, and the quantity of this debris is minimized by adjustment of the laser parameters and subsequent processes as described above. Much of the debris can be cleaned off chemically or prevented from landing on the surface by protecting the surface with a photoresist mask. A photomicrograph of the surface debris is shown in FIG. 17.

The benefit of increased throughput with a high degree of repeatability makes laser processing suitable for GaAs manufacturing of substrate vias. The reduction of chemical exposure allows for a safer working environment. Close observations of the method of the present invention over a period of a year reveal that the use of lasers in manufacturing vias in GaAs is a reliable and high yielding technology.

Having described and illustrated the principles of the invention in a preferred embodiment thereof, it will be apparent to those skilled in the art that the invention can be modified in arrangement and detail without departing from such principles. I therefore claim all modifications and variation coming within the spirit and scope of the following claims.

We claim:

1. A method of forming substrate vias in a GaAs wafer, the method comprising the steps of
    (a) providing a GaAs wafer having a top surface, an active integrated circuitry layer including metal via contacts, a GaAs substrate, and a bottom surface;
    (b) forming a protective layer on the top surface of the wafer;
    (c) removing a portion of the substrate from the bottom surface to achieve a predetermined substrate thickness;
    (d) metalizing the bottom surface with a first metal layer;
    (e) laser drilling substrate vias from the bottom surface of the wafer to within a predetermined substrate thickness from the metal via contacts;
    (f) etching the substrate vias to remove the remaining substrate thickness;
    (g) metalizing the bottom surface and the substrate vias with a second metal layer; and
    (h) removing the protective layer.

2. The method of claim 1 in which the step of providing a GaAs wafer comprises the step of providing a four inch diameter GaAs wafer.

3. The method of claim 1 including the steps of:
    forming alignment features from the top surface of the wafer and extending into the substrate of the wafer; and
    aligning a bottom surface substrate via mask to the alignment features after step (c).

4. The method of claim 3 in which the step of forming alignment features comprises the step of laser drilling alignment features.

5. The method of claim 3 in which the step of forming alignment features comprises forming the alignment features in a cruciform pattern between individual integrated circuit die on the wafer.

6. The method of claim 1 in which the step of forming a protective layer comprises the steps of:
    coating the top surface with an adhesive layer;
    attaching a carrier wafer to the adhesive layer; and
    applying pressure to the carrier wafer.

7. The method of claim 6 in which the step of coating the top surface comprises the step of spin coating the top surface with about a layer of Dynalith about four millimeters thick.

8. The method of claim 6 in which the step of attaching the carrier wafer to the adhesive layer comprises the step of attaching a sapphire carrier wafer having a plurality of holes extending through the wafer.

9. The method of claim 6 in which the step of applying pressure to the carrier wafer comprises the step of applying five pounds of pressure to the carrier wafer.

10. The method of claim 6 further comprising the step of baking the coupled GaAs and carrier wafers in a vacuum oven for about one and a half hours at a temperature of about one hundred fifty degrees Celsius.

11. The method of claim 1 in which the step of removing a portion of the substrate comprises the step of grinding the substrate.

12. The method of claim 1 in which the step of removing a portion of the substrate comprises removing a portion of the substrate such that the remaining portion of the substrate is about four millimeters thick.

13. The method of claim 1 in which the step of metalizing the bottom surface with a first metal layer comprises the step of:
depositing a first barrier metal layer; depositing an intermediate gold metal layer; and depositing a second barrier metal layer.

14. The method of claim 13 in which the step of depositing a first barrier metal layer comprises the step of depositing a titanium layer about one hundred fifty Angstroms thick.

15. The method of claim 13 in which the step of depositing an intermediate gold metal layer comprises the step of depositing a gold layer about three thousand five hundred Angstroms thick.

16. The method of claim 13 in which the step of depositing a second barrier metal layer comprises the step of depositing a titanium layer about one hundred Angstroms thick.

17. The method of claim 1 in which the step of laser drilling the substrate vias comprises the steps of:
positioning a frequency doubled Nd:YAG laser above the selected via location; and
emitting a controlled number of single pulses from the frequency doubled Nd:YAG laser over the selected via location at a predetermined repetition rate.

18. The method of claim 1 in which the step of laser drilling the substrate vias comprises the step of laser drilling the substrate vias to within about fifteen microns from the respective metal via contacts.

19. The method of claim 1 further comprising the step of coating the bottom surface with a layer of photoresist between steps (d) and (e).

20. The method of claim 1 in which the step of etching the substrate vias comprises the step of wet etching the substrate vias with a combination citric acid and hydrogen peroxide solution.

21. The method of claim 20 further comprising the steps of:
rotating the wafer; and
bombarding the wafer with ultrasonic or megasonic sound waves.

22. The method of claim 1 in which the step of metalizing the bottom surface and the substrate vias with a second metal layer comprises the steps of:
depositing a first metal layer component;
depositing a second metal layer component; and
depositing a third metal layer component.

23. The method of claim 22 in which the step of depositing a first metal layer comprises the step of depositing a titanium layer about eight hundred Angstroms thick.

24. The method of claim 22 in which the step of depositing a second metal layer comprises the step of depositing a palladium layer about four hundred Angstroms thick.

25. The method of claim 22 in which the step of depositing a third metal layer comprises the step of depositing a gold layer about four thousand five hundred Angstroms thick.

26. The method of claim 22 further comprising the step of plating a gold layer about 2.3 microns thick.

27. The method of claim 1 in which the step of removing the protective layer comprises the steps of:
applying a tape frame to the bottom surface;
loading the tape frame into a demount boat; and
placing the demount boat into a developer bath.

28. The method of claim 27 further comprising the step of agitating the developer bath with nitrogen.

29. The method of claim 27 further comprising the step of bombarding the developer bath with ultrasonic sound waves.

30. A method of forming substrate vias in a semiconductor wafer, the method comprising the steps of:
(a) providing a semiconductor wafer having a top surface, an active integrated circuitry layer including metal via contacts, a GaAs substrate, and a bottom surface;
(b) forming a protective layer on the top surface of the wafer;
(c) removing a portion of the substrate from the bottom surface to achieve a predetermined substrate thickness;
(d) metalizing the bottom surface with a first metal layer;
(e) applying a layer of photoresist to the bottom surface;
(f) patterning the layer of photoresist;
(g) laser drilling substrate vias from the bottom surface of the wafer to within a predetermined substrate thickness from the metal via contacts;
(h) etching the substrate vias to remove the remaining substrate thickness;
(i) metalizing the bottom surface and the substrate vias with a second metal layer; and
(j) removing the protective layer.

31. The method of claim 30 in which the step of providing a semiconductor wafer comprises the step of providing a four inch diameter wafer.

32. The method of claim 30 in which the step of providing a semiconductor wafer comprises the step of providing a GaAs wafer.

33. The method of claim 30 in which the step of forming a protective layer comprises the steps of:
coating the top surface with an adhesive layer;
attaching a carrier wafer to the adhesive layer; and
applying pressure to the carrier wafer.

34. The method of claim 33 in which the step of coating the top surface with an adhesive layer comprises the step of spin coating the top surface with a predetermined thickness of Dynalith.

35. The method of claim 30 in which the step of removing the protective layer comprises the steps of:
applying a tape frame to the bottom surface;
loading the tape frame into a demount boat; and
placing the demount boat into a developer bath.

36. The method of claim 35 in which the step of loading the tape frame into a demount boat comprises the steps of:

providing a demount boat having a substantially vertical slot for receiving the carrier wafer and an angled slot for receiving the tape frame; and loading the tape frame into the angled slot such that a portion of the tape frame extends over the vertical slot.

* * * * *

UNITED STATES PATENT AND TRADEMARK OFFICE
CERTIFICATE OF CORRECTION

PATENT NO.   :   5,292,686
DATED        :   March 8, 1994
INVENTOR(S)  :   Susan Riley et al.

It is certified that error appears in the above-identified patent and that said Letters Patent is hereby corrected as shown below:

Col. 8, line 67 - Claim 7 - delete ",,".

Col. 9, line 17, delete "I" and substitute --1--.

Signed and Sealed this

Third Day of January, 1995

BRUCE LEHMAN

Commissioner of Patents and Trademarks